(12) United States Patent
Dykyy et al.

(10) Patent No.: US 9,491,713 B2
(45) Date of Patent: Nov. 8, 2016

(54) COMPENSATOR MODULE FOR A TRANSCEIVER UNIT, RADIO SYSTEM AND METHOD OF OPERATING THEREOF

(71) Applicant: u-blox AG, Thalwil (CH)

(72) Inventors: Vasyl Dykyy, Frankfurt (DE); Igor Shevchenko, Frankfurt (DE); Oles Kryzhanskyi, Berlin (DE)

(73) Assignee: u-blox AG, Thalwil (CH)

( * ) Notice: Subject to any disclaimer, the term of this patent is extended or adjusted under 35 U.S.C. 154(b) by 0 days.

(21) Appl. No.: 14/817,997

(22) Filed: Aug. 4, 2015

(65) Prior Publication Data

US 2016/0044601 A1    Feb. 11, 2016

(30) Foreign Application Priority Data

Aug. 6, 2014   (DE) .......................... 10 2014 215 578

(51) Int. Cl.
| | |
|---|---|
| *H04W 24/00* | (2009.01) |
| *H04W 52/16* | (2009.01) |
| *H03G 3/30* | (2006.01) |
| *H04B 1/40* | (2015.01) |
| *H04W 52/18* | (2009.01) |
| *H04W 24/02* | (2009.01) |

(52) U.S. Cl.
CPC ........... *H04W 52/16* (2013.01); *H03G 3/3042* (2013.01); *H04B 1/40* (2013.01); *H04W 24/02* (2013.01); *H04W 52/18* (2013.01)

(58) Field of Classification Search
CPC .............................. H04W 24/02; H04W 52/16
USPC .................. 455/522, 69, 452.2, 67.11, 127.3
See application file for complete search history.

(56) References Cited

U.S. PATENT DOCUMENTS

| | | | |
|---|---|---|---|
| 8,010,067 B2 | 8/2011 | Pyne | |
| 8,090,051 B2 * | 1/2012 | Hoyerby | ............... H03F 1/3241 375/297 |

(Continued)

FOREIGN PATENT DOCUMENTS

| | | |
|---|---|---|
| EP | 0684707 A1 | 11/1995 |
| EP | 1383258 A1 | 1/2004 |

OTHER PUBLICATIONS

Examination Report for German Patent Application No. 10 2014 215 578.9, dated Oct. 23, 2015, pp. 1-7.

(Continued)

*Primary Examiner* — John J Lee
(74) *Attorney, Agent, or Firm* — Westberg Law Offices

(57) ABSTRACT

A compensator module (100), which can be connected to a transceiver unit (200) by an antenna cable (24), comprising a signal input (31) configured for supplying a provided transmitter power (SL) in a first frequency band (FB1), which is provided by the transceiver unit (200) to the compensator module (100) as a transmitter input power (ESL), a transmitter amplifier (9) for amplifying the supplied transmitter input power (ESL) to an transmitter output power (ASL), a signal output (32) for delivering the transmitter output power (ASL) in the first frequency band (FB1) to an antenna (ANT) or an equivalent load (13), wherein the compensator module (100) is configured generate a parameter (K) which represents the output transmitter power (ASL), and wherein the compensator module (100) comprises a data interface (33) configured to transmit the parameter (K) to the transceiver unit (200) over the antenna cable (24).

21 Claims, 2 Drawing Sheets

(56) References Cited

U.S. PATENT DOCUMENTS

| | | |
|---|---|---|
| 8,935,125 B1 | 1/2015 | Fu et al. |
| 2004/0121753 A1 | 6/2004 | Sugar et al. |
| 2005/0250541 A1 | 11/2005 | Bird et al. |
| 2009/0004981 A1* | 1/2009 | Eliezer .................. H03F 1/0211 455/127.1 |
| 2010/0291915 A1* | 11/2010 | Nast ..................... H04B 1/0057 455/422.1 |
| 2011/0188601 A1* | 8/2011 | Ko ......................... H04L 27/04 375/295 |
| 2014/0148214 A1 | 5/2014 | Sasson |

OTHER PUBLICATIONS

Supplementary European Search Report for Application No. 15179903.8-1874/2983298, dated Apr. 25, 2016, pp. 1-12.

* cited by examiner

COMPENSATOR MODULE FOR A TRANSCEIVER UNIT, RADIO SYSTEM AND METHOD OF OPERATING THEREOF

This application claims priority from German Patent Application No. 10 2014 215 578.9 (DE) filed Aug. 6, 2014 and entitled, "Kompensatormodul für eine Sendeempfängereinheit, Funksystem sowie Verfahren zum Betreiben desselbigen," the entire contents of which are hereby incorporated by reference.

BACKGROUND OF THE INVENTION

The present invention relates to a compensator module that is configured for connection to a transceiver unit by means of an antenna cable, e.g. a coaxial cable. The invention also relates to a radio system comprising a compensator module and a transceiver unit that can be connected to one another via an antenna cable. The invention further relates to a method for operating a radio system comprising a compensator module and a transceiver unit.

Compensator modules that are intended for connection to a transceiver unit by means of an antenna cable are essentially known from the prior art. A compensator module (also referred to as an antenna booster in the prior art) amplifies a transmitter power that is provided at the output of a transceiver unit. A compensator module has a signal input for a signal of interest that is configured to receive a transmitter power provided by a transceiver unit. The transmitter power is provided in a transmitter frequency band, e.g. in the VHF band. A transmitter power which is provided at the output of the transceiver unit is typically subjected to a line loss before it is supplied to an antenna. The line loss can be compensated for by interconnecting a compensator module between the transceiver unit and the antenna.

In order to compensate for a line loss, a compensator module in accordance with the prior art comprises a transmitter amplifier for amplifying the supplied transmitter input power to produce a transmitter output power, and a signal output for the signal of interest for delivering the transmitter output power to an antenna or equivalent load.

A radio system can be formed by a compensator module and a transceiver unit that can be connected to one another via an antenna cable. Transceiver units that are known in the prior art comprise a baseband processor, a tuner, a transmitter amplifier, a receiver amplifier, a TX/RX switch and a transceiver connection. The baseband processor is connected to the tuner which for its part comprises a connection to the transmitter amplifier and to the receiver amplifier. Transmitter amplifiers and receiver amplifiers are connected in a switchable manner to a shared transmitter module connection via a transceiver-side TX/RX switch, wherein an antenna can be connected to the shared transmitter module connection.

In known methods for operating a compensator module or radio system, provision is made to supply a transmitter power in a transmitter frequency band, which transmitter power is provided at the output of the transceiver unit, into the compensator module as transmitter input power, and to deliver a transmitter output power in the transmitter frequency band to an antenna by means of the compensator module.

The object of the present invention is to make possible an improved radio system.

SUMMARY OF THE INVENTION

The present invention is directed to a compensator module for a transceiver unit, a radio system and a method of operating thereof. In accordance with an embodiment, a compensator module is configured for connection to a transceiver unit via an antenna cable. The compensator module comprises a signal input configured for supplying a provided transmitter power in a first frequency band, which is provided by the transceiver unit, the transmitter power being supplied to the compensator module as a transmitter input power. A transmitter amplifier is configured for amplifying the transmitter input power to provide a transmitter output power. A signal output is configured for delivering the transmitter output power in the first frequency band to an antenna or an equivalent load. The compensator module is configured to produce a parameter that represents the transmitter output power. The compensator module comprises a data interface configured to transmit the parameter to the transceiver unit over the antenna cable.

BRIEF DESCRIPTION OF THE DRAWINGS

Exemplified embodiments of the invention will now be described hereinafter with reference to the drawings. Further advantages, features and details of the invention will be apparent from the description hereinafter of the preferred exemplified embodiments and with reference to the drawings, in which.

DETAILED DESCRIPTION OF THE INVENTION

Figure 1:
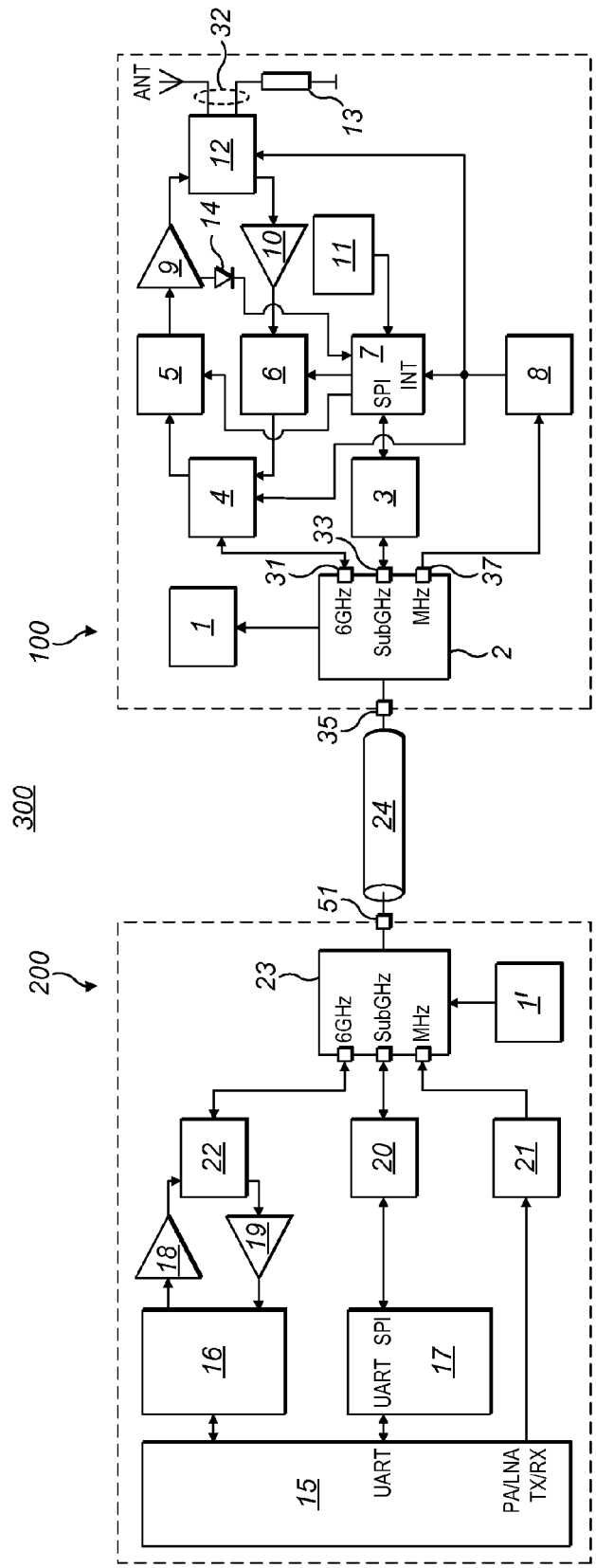
FIG. 1 shows a schematic view of an exemplary embodiment of a radio system comprising a transceiver unit and a compensator module that are connected to one another via an antenna cable.

The present invention takes account of the fact that existing radio systems have previously not been satisfactorily prepared to compensate for the above-described power losses.

A compensator module in accordance with an embodiment of the present invention is designed to determine a transmitter output power of the compensator module and to generate therefrom a parameter that represents the transmitter output power. The parameter can be determined from the transmitter output power or from a difference between the transmitter output power and a transmitter power. The compensator module comprises a data interface that is configured to transmit the parameter to the transceiver unit via the antenna cable during operation.

The invention is based on the fact that, on the one hand, by generating a parameter that represents the transmitter output power and/or the difference between the transmitter output power and the transmitter power, and on the other hand, by transmitting the parameter to the transceiver unit via the antenna cable, an optimal prerequisite for compensating the line loss over a cable is provided.

With the aid of the parameter, the transmitter power provided at the output of the transceiver unit can be adapted such that a desired level of the transmitter output power of the compensator module results.

The compensator module is thus particularly suited for use for in vehicular communication systems, such as a Car-to-Car (C2C), Car-to-Roadside (C2R) or Car-to-Infrastructure (C2I) communication system that require a maximum level of the transmitter output power of approximately 33 dBm (2 watts).

Preferably, the transmitter frequency band is a DSRC (dedicated short range communication) frequency band in the range of 5.855 GHz-5.925 GHz, in particular in accordance with ETSI EN 302 571, ETSI EN 302 663 or IEEE 802.11 p.

With the aid of the parameter, which is transmitted to the transceiver unit from the compensator module via the data interface, the transceiver unit can calculate the difference between the transmitter input power and the transmitter power provided at the output of the transceiver, i.e. the cable loss.

The transceiver unit can then increase its transmitter power, which is provided at its output, by the value of the cable loss, in order thereby to achieve a desired transmitter output power at the compensator module. If a transmitter power provided at the output side of the transceiver unit is e.g. 37 dBm and a line loss is e.g. 7 dB, which is typical in the case of a 6 m long coaxial cable at a frequency of approximately 6 GHz, then the transmitter power supplied via the signal input for the signal of interest into the compensator module is 30 dBm. If it is assumed that the amplification factor of the transmitter amplifier is 1 (0 dB), then a transmitter output power of 30 dBm is also present at the signal output for the signal of interest. Accordingly, the compensator module will determine the transmitter output power of 30 dBm and from this will determine a corresponding parameter that is transmitted to the transceiver unit. If then a C2C-typical transmitter output power of e.g. 33 dB is desired, then by virtue of the communicated parameter representing the transmitter output power, the transceiver unit can thus increase the transmitter power provided at the output of the transceiver unit by 3 dB in this example.

It is likewise feasible for the compensator module to be designed to determine the difference between the transmitter input power and transmitter power itself. For this purpose, the compensator module can communicate e.g. a factory-preset initial parameter via the data interface to the transceiver unit, whereupon the transceiver unit provides a defined transmitter power level. By reference to the transmitter output level actually present at the signal output for the signal of interest, when the amplification factor of the transmitter amplifier is known, the compensator module can deduce the transmitter input power supplied at its input. Using the ascertained transmitter input power and the transmitter power of the transceiver unit, which is adjusted on the basis of the factory-preset parameter, it is then possible by subtraction to calculate the power loss via the coaxial cable.

In a preferred variant of the compensator module, the parameter is transmitted in a data frequency band that is below the transmitter frequency band for the signal of interest. A second frequency band is below a first frequency band if the highest frequency of the second frequency band is lower than the lowest frequency of the first frequency band. If e.g. a range of 5.855 GHz-5.925 GHz is used for the transmitter frequency band, a suitable data frequency band, e.g. an ISM Band (Industrial, Scientific and Medical Band) is in the range of 433.05 MHz-434.79 MHz. However, other ISB bands are also feasible, e.g. ISM-868 MHz. In general, a data frequency band in the sub-GHz range is preferred. In order to transmit the parameter to a transceiver unit, the compensator module advantageously comprises a compensator module-side data module, in particular a UART Transceiver (Universal Asynchronous Receiver Transmitter). For example, this UART transceiver can be used not only to transmit the parameter but also e.g. to update the software of the compensator module by means of a transceiver unit.

The compensator module can be configured to measure the transmitter output power and to establish in particular the power level of the transmitter output power as a parameter. Alternatively or in addition, the parameter can represent the difference between the transmitter input power and transmitter output power. In an advantageous manner, the compensator module can comprise a detector that is connected to the transmitter amplifier in order to determine the transmitter output power. The compensator module can comprise a microcontroller that is connected to the detector and designed to produce the parameter.

In one advantageous embodiment of the compensator module, the signal input for the signal of interest and the data terminal are coupled to a shared compensator module connection, preferably by means of a frequency multiplexer. In this way, a transmitter power provided by a transceiver unit at its output and a parameter provided by the compensator module can be transmitted by one and the same antenna cable that connects the compensator module to the transceiver unit.

In a further advantageous embodiment, the compensator module comprises two TX/RX switches for switching between a transmitter path and a receiver path. The first TX/RX switch is preferably connected upstream of the input of the transmitter amplifier and downstream of the output of a receiver amplifier included in the compensator module. The second TX/RX switch can be connected upstream of the input of the receiver amplifier and downstream of the output of the transmitter amplifier.

It has proven to be advantageous if a first attenuator, which can be controlled by the microcontroller, is interconnected in the transmitter path between the first TX/RX switch and the transmitter amplifier. Alternatively or in addition, a second attenuator, which can be controlled by the microcontroller, can be interconnected in the receiver path between the first TX/RX switch and the receiver amplifier. Preferably, the transmitter amplifier has an amplification of 0-30 dB. A respective attenuator can have an attenuation of 0-15 dB.

Preferably, the compensator module comprises a control input for supplying a control signal that is able to switch the TX/RX switch(es). In this manner, external activation can be used for switching between a transmitting operation and a receiving operation of the compensator module. The second TX/RX switch can be connected and/or connectable to an external antenna or to an equivalent load, e.g. a 50 ohm equivalent load. The second TX/RX switch is switched between the antenna and equivalent load preferably by activation by means of the control signal.

In order to minimize possible line losses between the compensator module and an antenna to be connected, e.g. a car roof antenna, the compensator module can be integrated in the housing of a car roof antenna.

Preferably, the control signal is modulated in a control frequency band that is below the data frequency band. In the case of a typical data frequency band in the range of 433.05 MHz-434.79 MHz, the control frequency band can be e.g. in the lower MHz range. An FSK modulation or an OOK modulation can be used as modulation methods for the control signal. Accordingly, the compensator module can comprise an FSK/OOK demodulator that is connected to the TX/RX switches and configured to demodulate the control signal from the control frequency band.

The signal input for the signal of interest and the control input can be coupled to a shared compensator module connection, preferably by means of a frequency multiplexer. It has proven to be particularly advantageous to couple the signal input for the signal of interest, the control input and the data terminal to a shared compensator module connection. Therefore, the supply of a transmitter input power, the switching between the transmitting operation and receiving operation and the transmission of the parameter can be effected over one and the same coaxial cable, preferably each on carrier frequencies of different frequency bands.

In order to supply current in a simple manner to the compensator module, it can be advantageous to remotely supply power to the compensator module, preferably with direct current (DC), via the shared compensator module connection.

The compensator module is configured to determine the transmitter output power and to produce therefrom a parameter that represents the transmitter output power and/or the difference between the transmitter output power and transmitter power, wherein the compensator module comprises a data interface that is configured to transmit the parameter to the transceiver unit, the compensator module can comprise a temperature sensor that is configured to calibrate the transmitter output power, or the received signal strength (RSSI), or both, of the compensator module. In this manner, it is possible to realize a temperature compensation which is located solely in the compensator module, i.e. a temperature compensation, and which is independent of the transceiver unit. It can be advantageous to design the compensator module such that the temperature sensor is connected to the microcontroller.

In relation to the radio system, the object is achieved by an above-described compensator module and a transceiver unit that can be connected to the compensator module via an antenna cable, wherein the transceiver unit is designed to receive a parameter, which represents the output transmitter output power and/or the difference between the transmitter output power and the transmitter power, from the compensator module and wherein the transceiver unit is further designed to control the power level of the transmitter power provided by the transceiver unit as a function of the transmitted parameter.

In one advantageous embodiment, the transceiver unit comprises a transceiver-side frequency multiplexer (transmitting frequency multiplexer) that is connected to the shared transmitter module connection. Preferably, the frequency multiplexer is designed to relay a transmitter power in a transmitter frequency band from the transceiver-side transmitter amplifier to the shared transmitter module connection and to relay a receive power, supplied to the shared transmitter module connection, in a transmitter frequency band to the transceiver side receiver amplifier.

The parameter which is provided by the compensator module and is modulated on a data frequency band can likewise be transmitted by the shared transmitter module connection to the transceiver unit and is preferably coupled to the same transceiver-side frequency multiplexer as the transmitter power/receive power.

It has proven to be advantageous to equip the transceiver unit with a transceiver-side data transceiver module that is designed to receive the parameter, which is modulated on a data frequency band, and to relay same to a microcontroller included on the transceiver side. Preferably, the transceiver-side data transceiver module is the communicative counterpart of the compensator module-side data transceiver module.

As an equivalent of the compensator module-side demodulator, the transceiver unit can comprise a modulator, preferably an FSK or OOK modulator. The modulator can modulate a control signal, which is provided by the baseband processor and is intended to switch the compensator module-side TX/RX switch, to a carrier frequency in a control frequency band. In an advantageous manner, the modulator is connected to the shared transmitter module connection via the transceiver-side frequency multiplexer and therefore the transmitter power, control signal and parameter are transmitted via one and the same shared transmitter module connection between the transceiver unit and compensator module, preferably in each case on carrier frequencies in different frequency bands.

In a preferred embodiment, the transceiver unit comprises, in addition to the shared transmitter module connection, an additional antenna connection for connecting an antenna. In this manner, an optimum transmitting/receiving characteristic can be achieved on a car by virtue of the fact that a dedicated antenna can be allocated to the transceiver unit and to the compensator module, wherein the antennas are preferably spaced apart from one another.

Accordingly, a radio system can comprise a first antenna allocated to the transceiver unit and a second antenna allocated to the compensator module. The first antenna can be connected to the additional antenna connection of the transceiver unit. The second antenna can be connected to the signal output for the signal of interest of the compensator module.

In relation to the method, the object is achieved by a method comprising the steps of:
  supplying a transmitter power, which is provided by the transceiver unit at its output, in a transmitter frequency band to the compensator module as a transmitter input power,
  delivering a transmitter output power in the transmitting frequency band to an antenna or an equivalent load by means of the compensator module,
  determining the transmitter output power by means of the compensator module and generating therefrom a parameter by means of the compensator module, wherein the parameter represents the transmitter output power and/or the difference between the transmitter output power and transmitter power,
  transmitting the parameter from the compensator module to the transceiver unit via a data interface of the compensator module,
  controlling the power level of the transmitter power, which is provided by the transceiver unit at its output as a function of the transmitted parameter.

The method in accordance with the invention can be configured by one or a plurality of further steps.

For instance, an initial parameter, which is stored in the compensator module and corresponds to a predefined transmitter power, e.g. factory-set to be provided by the transceiver unit, can be transmitted to the transceiver unit. In order to produce a defined transmitter power, which is provided by the transceiver unit, the baseband processor of the transceiver unit can output a defined pilot tone.

The method in accordance with the invention can comprise method steps that correspond to the device features explained in relation to the compensator module/radio system—and vice versa. For example, if in relation to the compensator module it is stated that the module comprises a data interface that is designed to transmit the parameter to the transceiver unit, then the following method step is likewise disclosed:—transmitting the parameter from the compensator module to the transceiver unit via a data interface of the compensator module.

A radio system 300 in FIG. 1 comprises a compensator module 100 that is connected to a transceiver unit 200 via an antenna cable 24, which in this case is a coaxial cable. The antenna cable 24 is connected on the compensator module 100 side to the shared compensator module connection 35, which in this case is a coaxial connection. On the transceiver unit 200 side, the antenna cable 24 is connected to the shared transceiver connection 51 of the transceiver unit 200. The antenna cable 24, which in this case is a coaxial cable, has at 6 m long a loss of up 7 dB at a frequency of 6 GHz.

The compensator module 100 comprises a signal input 31 for the signal of interest, which is intended to supply a provided transmitter power SL provided by the transceiver unit 200. In this case, the transmitter power SL provided by the transceiver unit 200 is provided in a transmitter frequency band FB1 that corresponds to the standard ETSI EN 302 571 at a frequency of 5.855 GHz to 5.925 GHz.

The compensator module 100 further comprises a data interface 33 and a control input 37. In the present case, the signal input 31 for the signal of interest, the data interface 33 and the control input 37 are coupled to the shared compensator module connection 35 via a shared frequency multiplexer 2. Also connected to the multiplexer 2 is a power supply unit 1, which in this case, supplies the compensator module 100 with direct current (DC).

The compensator module further comprises a first TX/RX switch 4, a first attenuator 5, a second attenuator 6, a microcontroller 7, a demodulator 8, a transmitter amplifier 9, a receiver amplifier 10, a temperature sensor 11 and a second TX/RX switch 12. The compensator 100 likewise comprises a detector 14 that is designed to determine an output power of the transmitter amplifier 9 and is connected to the transmitter amplifier 9. The two TX/RX switches 4, 12 are designed to switch between a transmitter path TP and a receiver path RP. The first TX/RX switch 4 is connected upstream of the input of the transmitter amplifier 9 and is connected downstream of the output of the receiver amplifier 10. The second TX/RX switch 12 is connected upstream of the input of the receiver amplifier 10 and is connected downstream of the output of the transmitter amplifier 9. The first attenuator 5 is interconnected in the transmitter path TP between the first TX/RX switch 4 and the transmitter amplifier 9. The second attenuator 5 is interconnected between the first TX/RX switch 4 and the receiver amplifier 10 in the receive path RP. In this case, the first attenuator 5 and the second attenuator 6 are designed as digitally controlled attenuators. The first attenuator 5 is connected to and is controllable by the microcontroller 7; likewise the second attenuator 6 is connected to and is controllable by the microcontroller 7.

The transmitter path TP is thus formed by the chain of the TX/RX switch 4, first attenuator 5, transmitter amplifier 9 and second TX/RX switch 12. The receiver path RP is formed by the chain of the second TX/RX switch 12, receiver amplifier 10, second attenuator 6 and first TX/RX switch 4. As already mentioned, the wanted signal input 31, the control input 37 and the data interface 33 are coupled to the shared frequency multiplexer 2, the function of which will now be explained in connection with the transceiver-side frequency multiplexer 23 that is arranged inside the transceiver unit 200.

However, firstly the transceiver 200 will be described more precisely. The transceiver unit 200 in FIG. 1 comprises a baseband processor 15, an RF tuner 16, a microcontroller 17, a transmitter amplifier 18, a receiver amplifier 19, a TX/RX switch 22, a data module (a sub-GHz transceiver) 20, a modulator 21 and a transceiver-side frequency multiplexer 23. The baseband processor 15 is connected to the RF tuner 16 which, in turn, is connected to the transceiver-side TX/RX switch 22 via the transmitter amplifier 18 or receiver amplifier 19. Likewise, the baseband processor 15 is connected via the microcontroller 17 to the data module 20 which, in turn, is communicatively connected to the transceiver-side frequency multiplexer 23. In this case, the communicative connection between the data module 20 and multiplexer 23 is a bidirectional connection. Furthermore, the baseband processor 15 is connected to the modulator 21 which in this case is designed as an FSK modulator and for its part comprises, in turn, a connection to the transceiver-side frequency multiplexer 23. Likewise connected to the transceiver-side frequency multiplexer 23 is a transceiver-side power supply unit 1' which in this case is designed as a direct current (DC) supply.

Where required, a transmitter power SL, which is generated by the transmit amplifier 18, is supplied via the TX/RX switch 22 to the transceiver-side frequency multiplexer 23. A control signal of the modulator 21 and a data signal of the data module 20 and a direct current are likewise supplied to this frequency multiplexer 23 via the power supply unit 1'. Therefore, a signal of interest in the form of a transmitter power, a data signal, a control signal and a current supply are combined in the transceiver-side frequency multiplexer 23 such that they can be routed out of the transceiver unit 200 via the shared transmit module connection 51 which in this case is configured as a coaxial connection.

The transmitter power is provided in a transmitter frequency band FB1 which includes the carrier frequency of the signal of interest of approximately 6 GHz. The data of the transceiver-side data module 20 is transmitted in a data frequency band FB2, wherein the data frequency band FB2 is below the transmitter frequency band FB1 and includes a frequency of 868 MHz. The control signal which, in turn, is output by the transceiver-side modulator 21 is modulated in a control frequency band FB3 which in this case includes a 60 MHz carrier frequency, wherein the control frequency band FB3 is below the data frequency band FB2.

A transmitter power SL in a transmitter frequency band FB1, a data stream, comprising the parameter K, in a data frequency band FB2, a control signal modulated in a control frequency band FB3 and a direct current in the form of a remote power supply are collectively transmitted via the antenna cable 24 that connects the compensator module 100 to the transceiver unit 200. On the compensator module 100 side, these four collectively transmitted components are separated by the compensator module-side frequency multiplexer 2.

The function of the control signal coupled to the control input 37 will be explained in greater detail hereinafter. The control signal passes via the control input 37 as an FSK-modulated signal into the compensator module 100 and is intended to be demodulated via the modulator 8 and to switch the two TX/RX switches 4, 12 such that they switch through either the transmitter path TP or the receiver path RP.

The method for operating a radio system for compensating for a cable loss will be described more precisely hereinafter.

In a first step, an initial parameter SK, which is stored in the microcontroller 7 in the factory and which corresponds to a transmitter power SL, is transferred by the microcontroller 7 to the compensator data module (a sub-GHz transceiver) 3. In the compensator data module 3, the notional starting parameter SK is modulated to a carrier signal, which is in the data frequency band FB2, and is transmitted to the transceiver unit 200. By virtue of this parameter SK, which is stored in the microcontroller 7 in the factory, a defined transmitter power SL, e.g. at a level of 30 dBm, is output by the transceiver unit 200. The value of the transmitter power which by virtue of the factory-preset parameter SK is output by the transceiver unit 200, is stored likewise as such in the microcontroller 7 of the compensator module 100. In other words, the microcontroller 7 knows which transmitter power the transceiver unit 200 sets as a function of the factory-stored initial parameter SK.

In a next step, the compensator module 100 measures the transmitter output power ASL across the equivalent load 13 which for this purpose is connected to the output of the TX/RX switch 12. For this measurement, a constant amplification factor of the transmitter amplifier 9 is specified. From the difference between the transmitter output power measured across the equivalent load 13 and the transmitter power actually output by the transceiver unit 200, it is possible to determine a loss across the antenna cable 24 by subtraction. This subtraction can be performed, on the one hand, in the compensator module 100 but can also be performed alternatively or in addition in the transceiver unit 200.

In a next step, the power loss across the antenna cable 24 is now known, the transceiver unit 200 outputs such a high transmitter power level that this power level, reduced by the cable loss, corresponds to a transmitter output power level that is desired on the antenna of the compensator module 100.

In a further step, the compensator module 100 can re-measure the transmitter output power and from this generate the parameter K which, in turn, is transmitted to the transceiver unit 200 with a continuous calibration interval.

Figure 2:
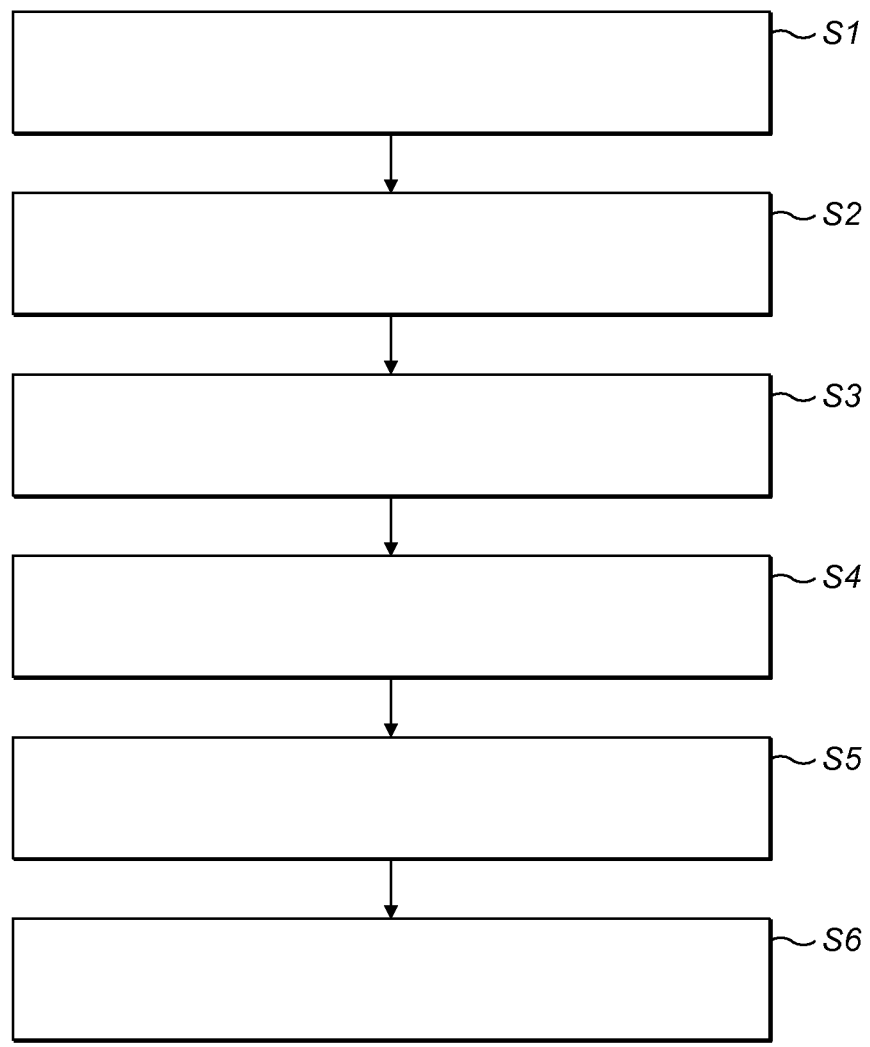
FIG. 2 shows a schematic view of an exemplary embodiment of a method for operating a radio system.

A method for operating a radio system will now be described further with reference to FIG. 2.

In a first step, S1, an initial parameter, which is stored in the compensator module and which corresponds to a predefined transmitter power to be provided by the transceiver unit, is transmitted to the transceiver unit.

In a second step S2, the transmitter power, which is provided by the transceiver unit at its output side and corresponds to the initial parameter, is supplied to the compensator module as a transmitter input power.

In a third step S3, a transmitter output power in the transmitter frequency band is output to an equivalent load by the compensator module.

In a fourth step S4, the power level of the transmitter output power is measured by the compensator module and from this a parameter is produced which represents the difference between the transmitter output power and the provided transmitter power (line loss).

In a fifth step S5, the parameter is transmitted from the compensator module to the transceiver unit.

In a sixth step S6, the power level of the transmitter power which is provided by the transceiver unit at its output is controlled as a function of the transmitted parameter.

What is claimed is:

1. A compensator module connectable to a transceiver unit by an antenna cable, comprising:
    a signal input configured for supplying a provided transmitter power in a first frequency band, which is provided by the transceiver unit, the provided transmitter power being supplied to the compensator module as a transmitter input power,
    a transmitter amplifier configured for amplifying the transmitter input power to provide a transmitter output power,
    a signal output configured for delivering the transmitter output power in the first frequency band to an antenna or an equivalent load,
    wherein the compensator module is configured to generate a parameter that represents the transmitter output power, and
    wherein the compensator module comprises a data interface configured to transmit the parameter to the transceiver unit over the antenna cable.

2. The compensator module as claimed in claim 1, wherein the parameter is transmitted in a second frequency band that is below the first frequency band.

3. The compensator module as claimed in claim 1, comprising a detector coupled to the transmitter amplifier that is configured for determining the transmitter output power, and comprising a microcontroller coupled to the detector that is configured for generating the parameter.

4. The compensator module as claimed in claim 1, wherein the signal input and the data interface are coupled to a shared compensator module connection, by a multiplexer.

5. The compensator module as claimed claim 4, wherein the compensator module is remotely powered via the shared compensator module connection.

6. The compensator module as claimed in claim 1, wherein the parameter is determined from a difference between the transmitter output power and the provided transmission power.

7. The compensator module as claimed in claim 6, wherein the provided transmitter power is known from a preset initial value.

8. The compensator module as claimed in claim 1, wherein the provided transmitter power is controlled based on the parameter.

9. The compensator module as claimed in claim 1, wherein the provided transmitter power is controlled based on the parameter and wherein the parameter is transmitted to the transceiver unit with a continuous calibration interval.

10. The compensator module as claimed in claim 1, comprising two TX/RX switches for switching between a transmitter path and a receiver path, wherein the first TX/RX switch is connected upstream of the input of the transmitter amplifier and is connected downstream of the output of the receiver amplifier and the second TX/RX switch is connected upstream of the input of the receiver amplifier and is connected downstream of the output of the transmitter amplifier.

11. The compensator module as claimed in claim 10, further comprising one or both of a first attenuator or a second attenuator, the first attenuator in the transmit path between the first TX/RX switch and the transmit amplifier and being controllable by the microcontroller, the second attenuator in the receiver path between the first TX/RX switch and the receiver amplifier and being controllable by the microcontroller.

12. The compensator module as claimed in claim 10, comprising a control input for supplying a control signal that is able to switch the two TX/RX switches, wherein the control signal is modulated in a third frequency band that is below the second frequency band.

13. The compensator module as claimed in claim 12, wherein the signal input and the control input are coupled to a shared compensator module connection by a multiplexer.

14. The compensator module as claimed in claim 1, wherein the compensator module comprises a temperature sensor configured for calibrating one or both of the transmitter output power and the RSSI of the compensator module.

15. The compensator module as claimed in claim 1, wherein the compensator module is integrated in the housing of a car roof antenna.

16. A radio system comprising:
    a compensator module comprising:
        a signal input configured for supplying a provided transmitter power in a first frequency band, which is provided by a transceiver unit, the provided transmitter power being provided to the compensator module as a transmitter input power,
        a transmitter amplifier configured for amplifying the transmitter input power to provide a transmitter output power,
        a signal output configured for delivering the transmitter output power in the first frequency band to an antenna or an equivalent load,
        wherein the compensator module is configured to produce a parameter that represents the transmitter output power, and
        wherein the compensator module comprises a data interface configured to transmit the parameter to the transceiver unit over an antenna cable; and
    the transceiver unit configured to be connected to the compensator module via the antenna cable, wherein the transceiver unit is configured to receive the parameter from the compensator module, wherein the parameter represents the transmitter output power, and wherein the transceiver unit is further configured to control the provided transmitter power as a function of the parameter.

17. A method of operating a compensator module or a radio system, comprising the steps of:
    supplying a transmitter power in a first frequency band, the transmitter power being provided by a transceiver unit to the compensator module as a transmitter input power,
    delivering a transmitter output power in the first frequency band to an antenna or an equivalent load by the compensator module,
    determining the transmitter output power by the compensator module and producing therefrom a parameter, wherein the parameter represents the transmitter output power,
    transmitting the parameter from the compensator module to the transceiver unit via a data interface of the compensator module; and
    controlling the provided transmitter power as a function of the transmitted parameter.

18. The method as claimed in claim 17, wherein the parameter is transmitted in a second frequency band that is below the first frequency band.

19. The method as claimed in claim 17, wherein the parameter is determined from a difference between the transmitter output power and the provided transmitter power.

20. The method as claimed in claim 19, wherein the provided transmitter power is known from a preset initial value.

21. The method as claimed in claim 17, wherein the provided transmitter power is delivered to the compensator module via an antenna cable and where the parameter is transmitted from the data interface of the compensator module to the transceiver unit via the antenna.

* * * * *